US008947271B2

(12) United States Patent
Lynch et al.

(10) Patent No.: US 8,947,271 B2

(45) Date of Patent: Feb. 3, 2015

(54) MULTIPLE TECHNIQUE ENTROPY CODING SYSTEM AND METHOD

(75) Inventors: William C. Lynch, Palo Alto, CA (US); Krasimir D. Kolarov, Menlo Park, CA (US); Steven E. Saunders, Cupertino, CA (US)

(73) Assignee: Soryn Technologies, LLC, Jersey City, NJ (US)

( * ) Notice: Subject to any disclaimer, the term of this patent is extended or adjusted under 35 U.S.C. 154(b) by 0 days.

(21) Appl. No.: 13/155,280

(22) Filed: Jun. 7, 2011

(65) Prior Publication Data

US 2011/0234431 A1 Sep. 29, 2011

Related U.S. Application Data

(63) Continuation of application No. 12/234,472, filed on Sep. 19, 2008, now abandoned, which is a continuation of application No. 11/232,726, filed on Sep. 21, 2005, now Pat. No. 7,436,329, application No. 13/155,280, which is a continuation-in-part of application No. 10/944,437, filed on Sep. 16, 2004, now abandoned, and a continuation-in-part of application No. 10/418,649, filed on Apr. 17, 2003, now abandoned, and a continuation-in-part of application No. 10/418,363, filed on Apr. 17, 2003, now abandoned, (Continued)

(51) Int. Cl.

*H03M 7/34* (2006.01)
*H03M 7/40* (2006.01)
*H04N 19/13* (2014.01)
*H04N 19/60* (2014.01)
*H04N 19/12* (2014.01)
*H04N 19/136* (2014.01)
*H04N 19/18* (2014.01)
*H04N 19/169* (2014.01)

(52) U.S. Cl.

CPC .............. *H03M 7/40* (2013.01); *H03M 7/4075* (2013.01); *H04N 19/13* (2013.01); *H04N 19/60* (2013.01); *H04N 19/12* (2013.01); *H04N 19/136* (2013.01); *H04N 19/18* (2013.01); *H04N 19/1887* (2013.01)

USPC ................. 341/51; 341/65; 341/67; 341/106; 341/107

(58) Field of Classification Search

USPC ................................ 341/51, 65, 67, 106, 107

See application file for complete search history.

(56) References Cited

U.S. PATENT DOCUMENTS

| | | | | |
|---|---|---|---|---|
| 4,813,056 | A | 3/1989 | Fedele | |
| 5,574,449 | A * | 11/1996 | Golin | 341/65 |
| 5,812,076 | A * | 9/1998 | Yoshida | 341/106 |
| 6,121,904 | A * | 9/2000 | Levine | 341/65 |
| 6,373,411 | B1 * | 4/2002 | Shoham | 341/65 |
| 6,696,992 | B1 * | 2/2004 | Chu | 341/67 |
| 6,969,992 | B2 * | 11/2005 | Vaughan et al. | 324/318 |
| 7,016,547 | B1 * | 3/2006 | Smirnov | 382/245 |
| 7,671,766 | B2 * | 3/2010 | Pang et al. | 341/50 |

(Continued)

*Primary Examiner* — Linh Nguyen

(74) *Attorney, Agent, or Firm* — Davidson Berquist Jackson & Gowdey, LLP

(57) ABSTRACT

A system, method and computer program product having optimal matching to a known or measured probability distribution encodes data without the use of an excessively large lookup table. An encoder constructed according to the present invention uses two or more different encoding methods in combination. In one embodiment, Huffman coding by table lookup is combined with computational generation, such as by using an exponential Golomb equation. The most commonly occurring elements are looked up in a small Huffman table, while the remaining elements are coded with the equation. In another embodiment, data is encoded using two or more equations. In yet another embodiment, data is encoded using multiple tables in conjunction with one or more equations.

6 Claims, 6 Drawing Sheets

200

201 202 204 206

TRANSFORM → QUANTIZER → ENTROPY CODER

208 FILE 203 214 212 210

REVERSE TRANSFORM ← DE-QUANTIZER ← ENTROPY DE-CODER

Related U.S. Application Data and a continuation-in-part of application No. 10/447,455, filed on May 28, 2003, now abandoned, and a continuation-in-part of application No. 10/447,514, filed on May 28, 2003, now Pat. No. 7,844,122, and a continuation-in-part of application No. 10/955,240, filed on Sep. 29, 2004, now abandoned, and a continuation-in-part of application No. 11/232,165, filed on Sep. 20, 2005, now Pat. No. 7,525,463.

(60) Provisional application No. 60/612,311, filed on Sep. 21, 2004, provisional application No. 60/612,652, filed on Sep. 22, 2004, provisional application No. 60/612,651, filed on Sep. 22, 2004, provisional application No. 60/618,558, filed on Oct. 12, 2004, provisional application No. 60/618,938, filed on Oct. 13, 2004, provisional application No. 60/654,058, filed on Feb. 16, 2005.

(56) References Cited

U.S. PATENT DOCUMENTS

| | | | | |
|---|---|---|---|---|
| 7,965,206 | B2 * | 6/2011 | Choo et al. | 341/67 |
| 8,643,513 | B2 * | 2/2014 | Fallon | 341/51 |
| 2003/0227539 | A1 * | 12/2003 | Bonnery et al. | 348/14.1 |
| 2006/0050786 | A1 * | 3/2006 | Tanizawa et al. | 375/240.03 |
| 2007/0189209 | A1 * | 8/2007 | Awad et al. | 370/328 |
| 2010/0079312 | A1 * | 4/2010 | Choo et al. | 341/51 |
| 2012/0093226 | A1 * | 4/2012 | Chien et al. | 375/240.16 |

* cited by examiner

| SYMBOL | L | B | OUTPUT BITSTRING |
|---|---|---|---|
| 1 | 1 | 1 | 1 |
| 2 | 3 | 2 | 010 |
| 3 | 3 | 3 | 011 |
| 4 | 5 | 4 | 00100 |
| 5 | 5 | 5 | 00101 |
| 6 | 5 | 6 | 00110 |
| 7 | 5 | 7 | 00111 |
| 8 | 6 | 4 | 000100 |
| 9 | 6 | 5 | 000101 |
| 10 | 6 | 6 | 000110 |
| 11 | 6 | 7 | 000111 |
| 12 | 8 | 8 | 00001000 |
| 13 | 8 | 9 | 00001001 |
| 14 | 8 | 10 | 00001010 |
| 15 | 8 | 11 | 00001011 |

*FIG. 4*

| SYMBOL | L | B | OUTPUT BITSTRING |
|---|---|---|---|
| -15 | 9 | 23 | 000010111 |
| -14 | 9 | 21 | 000010101 |
| -13 | 9 | 19 | 000010011 |
| -12 | 9 | 17 | 000010001 |
| -11 | 7 | 15 | 0001111 |
| -10 | 7 | 13 | 0001101 |
| -9 | 7 | 11 | 0001011 |
| -8 | 7 | 9 | 0001001 |
| -7 | 6 | 15 | 001111 |
| -6 | 6 | 13 | 001101 |
| -5 | 6 | 11 | 001011 |
| -4 | 6 | 9 | 001001 |
| -3 | 4 | 7 | 0111 |
| -2 | 4 | 5 | 0101 |
| -1 | 2 | 3 | 11 |
| 0 | 0 | 0 | (unused) |
| 1 | 2 | 2 | 10 |
| 2 | 4 | 4 | 0100 |
| 3 | 4 | 6 | 0110 |
| 4 | 6 | 8 | 001000 |
| 5 | 6 | 10 | 001010 |
| 6 | 6 | 12 | 001100 |
| 7 | 6 | 14 | 001110 |
| 8 | 7 | 8 | 0001000 |
| 9 | 7 | 10 | 0001010 |
| 10 | 7 | 12 | 0001100 |
| 11 | 7 | 14 | 0001110 |
| 12 | 9 | 16 | 000010000 |
| 13 | 9 | 18 | 000010010 |
| 14 | 9 | 20 | 000010100 |
| 15 | 9 | 22 | 000010110 |

*FIG. 6*

MULTIPLE TECHNIQUE ENTROPY CODING SYSTEM AND METHOD

RELATED APPLICATIONS

The present application is a continuation of U.S. patent application Ser. No. 12/234,472, filed Sep. 19, 2008, which is a continuation of U.S. patent application Ser. No. 11/232,726, filed Sep. 21, 2005 and also claimed priority from provisional applications filed Sep. 21, 2004 under U.S. Patent Application No. 60/612,311 entitled RATE CONTROL WITH VARIABLE SUBBAND QUANTIZATION; filed Sep. 22, 2004 under U.S. Patent Application No. 60/612,652 entitled SPLIT TABLE ENTROPY CODING; filed Sep. 22, 2004 under U.S. Patent Application No. 60/612,651 entitled PERMUTATION PROCRASTINATION; filed Oct. 12, 2004 under U.S. Patent Application No. 60/618,558 entitled MOBILE IMAGING APPLICATION, DEVICE ARCHITECTURE, AND SERVICE PLATFORM ARCHITECTURE; filed Oct. 13, 2004 under U.S. Patent Application No. 60/618,938 entitled VIDEO MONITORING APPLICATION, DEVICE ARCHITECTURES, AND SYSTEM ARCHITECTURE; filed Feb. 16, 2005 under U.S. Patent Application No. 60/654,058 entitled MOBILE IMAGING APPLICATION, DEVICE ARCHITECTURE, AND SERVICE PLATFORM ARCHITECTURE AND SERVICES; each of which is incorporated herein by reference in its entirety.

The present application is a continuation-in-part of U.S. patent application Ser. No. 10/944,437 filed Sep. 16, 2004 entitled MULTIPLE CODEC-IMAGER SYSTEM AND METHOD, now U.S. Publication No. US2005/0104752 published on May 19, 2005; continuation-in-part of U.S. patent application Ser. No. 10/418,649 filed Apr. 17, 2003 entitled SYSTEM, METHOD AND COMPUTER PROGRAM PRODUCT FOR IMAGE AND VIDEO TRANSCODING, now U.S. Publication No. US2003/10206597 published on Nov. 6, 2003; continuation-in-part of U.S. patent application Ser. No. 10/418,363 filed Apr. 17, 2003 entitled WAVELET TRANSFORM SYSTEM, METHOD AND COMPUTER PROGRAM PRODUCT, now U.S. Publication No. US2003/0198395 published on Oct. 23, 2003; continuation-in-part of U.S. patent application Ser. No. 10/447,455 filed on May 28, 2003 entitled PILE-PROCESSING SYSTEM AND METHOD FOR PARALLEL PROCESSORS, now U.S. Publication No. US2003/0229773 published on Dec. 11, 2003; continuation-in-part of U.S. patent application Ser. No. 10/447,514 filed on May 28, 2003 entitled CHROMA TEMPORAL RATE REDUCTION AND HIGH-QUALITY PAUSE SYSTEM AND METHOD, now U.S. Publication No. US2003/0235340 published on Dec. 25, 2003; continuation-in-part of U.S. patent application Ser. No. 10/955,240 filed Sep. 29, 2004 entitled SYSTEM AND METHOD FOR TEMPORAL OUT-OF-ORDER COMPRESSION AND MULTISOURCE COMPRESSION RATE CONTROL, now U.S. Publication No. US2005/0105609 published on May 19, 2005; continuation-in-part of U.S. application Ser. No. 11/232,165 filed Sep. 20, 2005 entitled COMPRESSION RATE CONTROL SYSTEM AND METHOD WITH VARIABLE SUBBAND PROCESSING; each of which is incorporated herein by reference in its entirety. This application also incorporates by reference in its entirety U.S. Pat. No. 6,825,780 issued on Nov. 30, 2004 entitled MULTIPLE CODEC-IMAGER SYSTEM AND METHOD; U.S. Pat. No. 6,847,317 issued on Jan. 25, 2005 entitled SYSTEM AND METHOD FOR A DYADIC-MONOTONIC (DM) CODEC; and U.S. application Ser. No. 11/232/725 filed Sep. 21, 2005 entitled PERMUTATION PROCRASTINATION.

FIELD OF THE INVENTION

The present invention relates to data compression, and more particularly to efficiently encoding data elements based on their probability of occurrence.

BACKGROUND OF THE INVENTION

Directly digitized still images and video requires many "bits". Accordingly, it is common to compress images and video for storage, transmission, and other uses. Most image and video compressors share a basic architecture, with variations. The basic architecture has three stages: a transform stage, a quantization stage, and an entropy coding stage, as shown in FIG. 1.

Video "codecs" (compressor/decompressor) are used to reduce the data rate required for data communication streams by balancing between image quality, processor requirements (i.e. cost/power consumption), and compression ratio (i.e. resulting data rate). The currently available compression approaches offer a different range of trade-offs, and spawn a plurality of codec profiles, where each profile is optimized to meet the needs of a particular application.

The intent of the transform stage in a video compressor is to gather the energy or information of the source picture into as compact a form as possible by taking advantage of local similarities and patterns in the picture or sequence. Compressors are designed to work well on "typical" inputs and ignore their failure to compress "random" or "pathological" inputs.

Many image compression and video compression methods, such as MPEG-2, use the discrete cosine transform (DCT) as the transform stage.

Some newer image compression and video compression methods, such as MPEG-4 textures, use various wavelet transforms as the transform stage.

A wavelet transform comprises the repeated application of wavelet filter pairs to a set of data, either in one dimension or in more than one. For image compression, a 2D wavelet transform (horizontal and vertical) can be used. For video data streams, a 3D wavelet transform (horizontal, vertical, and temporal) can be used.

Prior Art FIG. 2 shows an example 100 of trade-offs among the various compression algorithms currently available. As shown, such compression algorithms include wavelet-based codecs 102, and DCT-based codecs 104 that include the various MPEG video distribution profiles.

2D and 3D wavelets, as opposed to DCT-based codec algorithms, have been highly regarded due to their pleasing image quality and flexible compression ratios, prompting the JPEG committee to adopt a wavelet algorithm for its JPEG2000 still image standard. Unfortunately, most wavelet implementations use very complex algorithms, requiring a great deal of processing power, relative to OCT alternatives. In addition, wavelets present unique challenges for temporal compression, making 3D wavelets particularly difficult.

For these reasons, wavelets have never offered a cost-competitive advantage over high volume industry standard codecs like MPEG, and have therefore only been adopted for niche applications. There is thus a need for a commercially viable implementation of 3D wavelets that is optimized for low power and low cost focusing on three major market segments.

For example, small video cameras are becoming more widespread, and the advantages of handling their signals digitally are obvious. For instance, the fastest growing segment of the cellular phone market in some countries is for phones with image and video-clip capability. Most digital still cameras have a video-clip feature. In the mobile wireless handset market, transmission of these still pictures and short video clips demand even more capacity from the device battery. Existing video coding standards and digital signal processors put even more strain on the battery.

Another new application is the Personal Video Recorders (PVR) that allow a viewer to pause live TV and time-shift programming. These devices use digital hard disk storage to record the video, and require video compression of analog video from a cable. In order to offer such features as picture-in-picture and watch-while-record, these units require multiple video compression encoders.

Another growing application area is the Digital Video Recorders (DVR) for surveillance and security video. Again, compression encoding is required for each channel of input video to be stored. In order to take advantage of convenient, flexible digital network transmission architectures, the video often is digitized at the camera. Even with the older multiplexing recorder architecture, multiple channel compression encoders are used.

Of course, there are a vast number of other markets which would benefit from a commercially viable compression scheme that is optimized for low power and low cost.

Entropy Coding

The goal of entropy coding (also known as "Source Coding" in the literature) is generally to produce, from a message or source of information, a shorter message that can later be decoded back into the original message, preferably exactly as the original. Typically this is done by dividing the source message into "symbols" and processing the message symbol-by-symbol, rather than by looking up larger blocks or even the entire input message (such as an image or a video GOP) in an excessively large codebook.

The class of entropy coders that works on fixed-size input symbols, and produces for each a variable-length bit string, is known in the literature as "block to variable coders".

Two Typical Ways to Encode a Symbol

Given an input symbol to encode, one way to do the encoding is to take the symbol as an index and look it up in a table called a °codebook". The entry found in the codebook is the encoded output for the symbol. The code book is typically large enough to provide an entry for every possible symbol.

In some implementations, a single random access to a table is very fast and efficient. However, in other implementations, random access to a large table is either relatively slow (because of cache memory loading) or relatively expensive (because of the cost of on-chip memory, as in an FPGA or ASIC).

A second typical scheme for encoding a symbol is to do some computational operations on its representation, usually a binary bit string, that produce the encoded output as their result. In this way, the output is produced without the need for a large codebook.

In some implementations, such computation is reasonably fast and efficient. However, in other implementations, multiple steps of computation may be needed and are relatively slow.

A decoder must be able to determine the length of each variable-size bit string (i.e. codeword) that is to be decoded back into a symbol. This is generally done by arranging for the codewords to have the "Huffman prefix property": that no codeword is a prefix of any other codeword.

Distributions

Entropy coding as described above works by taking advantage of non-uniform probability among the symbols. When a symbol has high probability of occurrence (meaning it occurs frequently in the message or source), it is encoded with a short codeword. When a symbol has a low probability of occurrence (meaning it occurs rarely in the message or source), it is encoded with a longer codeword. Thus the encoded output, with many short codewords and few long codewords, is usually shorter than the input.

An optimum encoding, as described by Shannon (C. E. Shannon, The Mathematical Theory of Communications, Bell System Technical Journal, July & October 1948), has the length of each output codeword inversely logarithmically related to the probability of the occurrence of its corresponding symbol in the source input. This is usually not achieved exactly, but encoder designs try to approximate it.

Therefore the probability distribution of the symbols is known, measured, approximated or assumed in order to design an entropy code that is effective.

For some distributions, the computational method of encoding can be done with very few steps, while for others many steps are needed to compute a good encoding.

In video compression work, the probability distribution of quantized coefficients can sometimes be awkward. In other words, the distribution is not one with a known fast computational encoding, but the number of possible values requires a codebook too large to fit in the available lookup storage.

Therefore, what is needed is an encoding scheme that is optimally matched to a known or measured probability distribution, but that does not require an excessively large lookup table.

SUMMARY

A system, method and computer program product having optimal matching to a known or measured probability distribution are disclosed for encoding data without the use of an excessively large lookup table. An encoder constructed according to the present invention uses two or more different encoding methods in combination.

According to one aspect of the invention, Huffman coding by table lookup is combined with computational codeword generation, such as by using an exponential Golomb equation. The most commonly occurring elements are looked up in a small Huffman table, while the remaining elements are coded with the equation. This arrangement offers the advantages of Huffman coding by table lookup (namely, optimum matching to-a known or measured probability distribution) combined with the advantages of simple computed coding (namely, quick computation with no lookup) while avoiding the disadvantage of full Huffman coding (namely, the need to support a very large table).

According to another aspect, data is encoded using two or more equations. In situations where a single equation does not fit a data type precisely, separate equations can be used, each for a different portion of the data, to better describe the overall data probability distribution.

According to yet another aspect, data is encoded using multiple tables in conjunction with one or more equations. Equations are used for portions of the data where the equations accurately describe the probability distributions of the data portions. Tables can be interspersed with the equations to cover gaps in the equations, such as where no fast computational encoding is known.

BRIEF DESCRIPTION OF FIGURES

FIG. 4 is a table used by the process of FIG. 3.

FIG. 6 is a table used by the process of FIG. 5.

DESCRIPTION OF THE PREFERRED EMBODIMENTS

Figure 1:
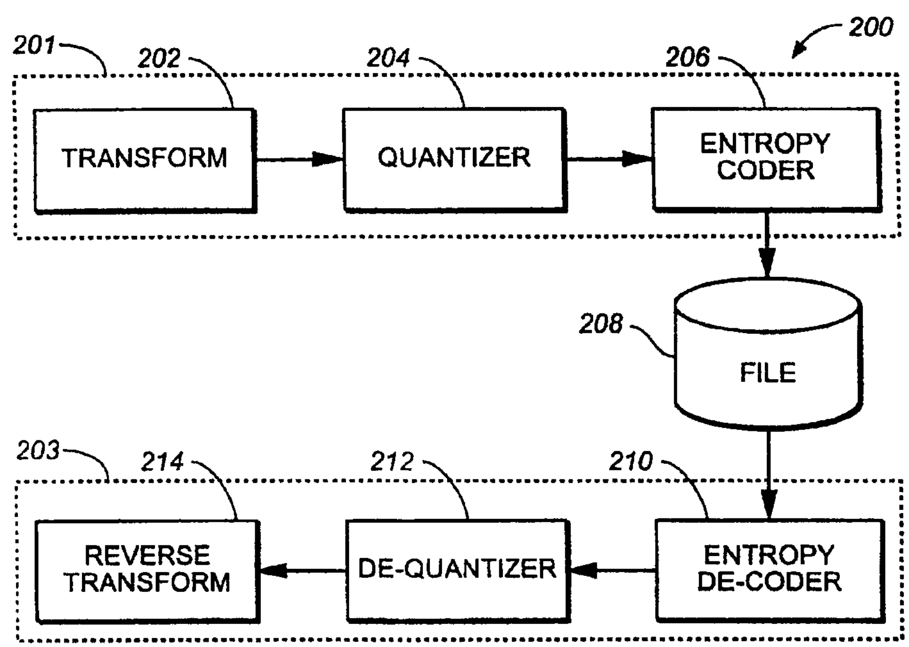
FIG. 1 illustrates a framework for compressing/decompressing data, in accordance with one embodiment.
Figure 2:
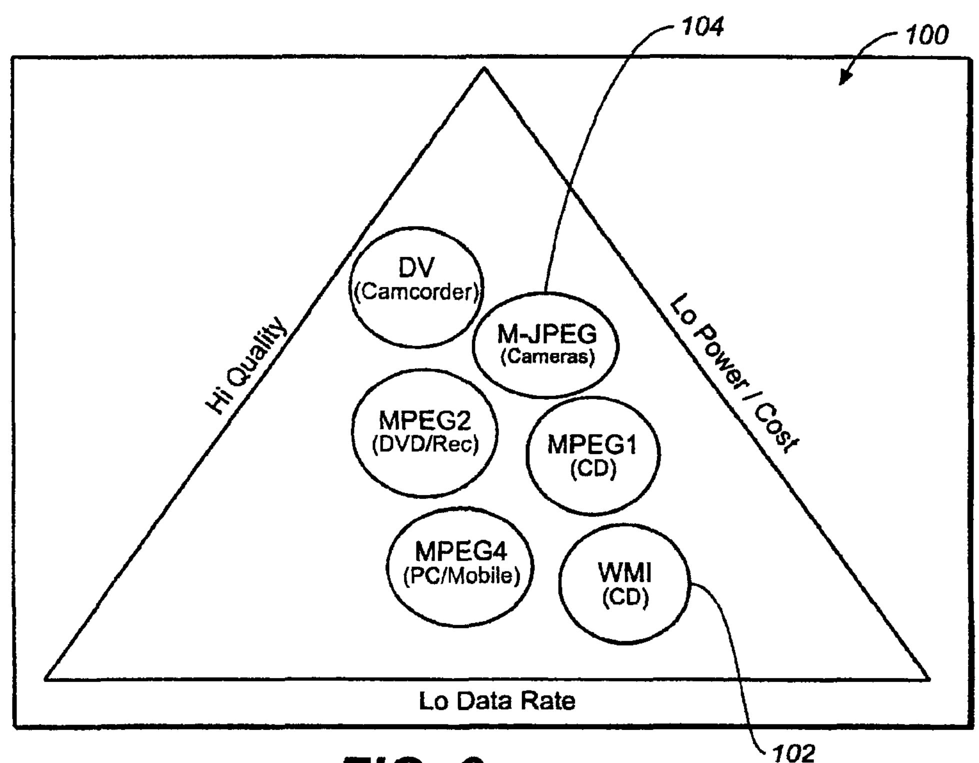
FIG. 2 shows an example of trade-offs among the various compression algorithms currently available.

FIG. 1 illustrates a framework 200 for compressing/decompressing data, in accordance with one embodiment. Included in this framework 200 are a coder portion 201 and a decoder portion 203, which together form a "codec." The coder portion 201 includes a transform module 202, a quantizer 204, and an entropy encoder 206 for compressing data for storage in a file 208. To carry out decompression of such file 208, the decoder portion 203 includes an entropy decoder 210, a de-quantizer 212, and a reverse transform module 214 for decompressing data for use (i.e. viewing in the case of video data, etc). In use, the transform module 202 carries out a reversible transform, often linear, of a plurality of pixels (in the case of video data) for the purpose of de-correlation. Next, the quantizer 204 effects the quantization of the transform values, after which the entropy encoder 206 is responsible for entropy coding of the quantized transform coefficients.

An encoder constructed according to the present invention uses two or more different encoding methods in combination. Some quantized video data distributions are well approximated by a negative exponential for large coefficient values (which have a low probability of occurrence in the input source), and a small table for the small coefficient values (the most frequently occurring, highest probability values in the input source). Thus, according to one aspect, only a small table may be used, a simple computational method, and a method to choose which of the two techniques (table or computational) to apply.

According to another aspect of the invention, the choice of which technique to apply to which data elements or symbols can be a simple magnitude test. In this example, the symbols to be entropy coded are always positive, ranging from 1 to 215-1. The value zero is excluded. The symbol is simply tested as to whether it is less than a fixed constant. If so, a table of the same size of the constant is used. If not, the computational method is used.

For small (frequent) values in this embodiment, a Huffman codeword in a lookup table is used. For large (less frequent) values, a codeword is calculated by equation, such as by using an exponential Golomb type equation. Such an implementation can encode symbol-by-symbol without keeping a history of what has been encoded. Constant length symbols are input to the encoder as 16 bits, and vary in output length from 1 bit (frequent value) to 16 bits (rare value).

Each of the two parts of the encoder has the Huffman prefix property separately. In other words, no codeword used for a symbol in one part of the encoder is equal to the beginning part of a codeword for another symbol in that same part of the encoder. With the range of probability distributions typical for many applications, the combined code for the two parts of the encoder also has the Huffman prefix property, so that no extra marker bits are needed in the output stream of codewords to indicate to a decoder where one codeword ends and the next begins.

EXAMPLE ALGORITHM 1

Figure 3:
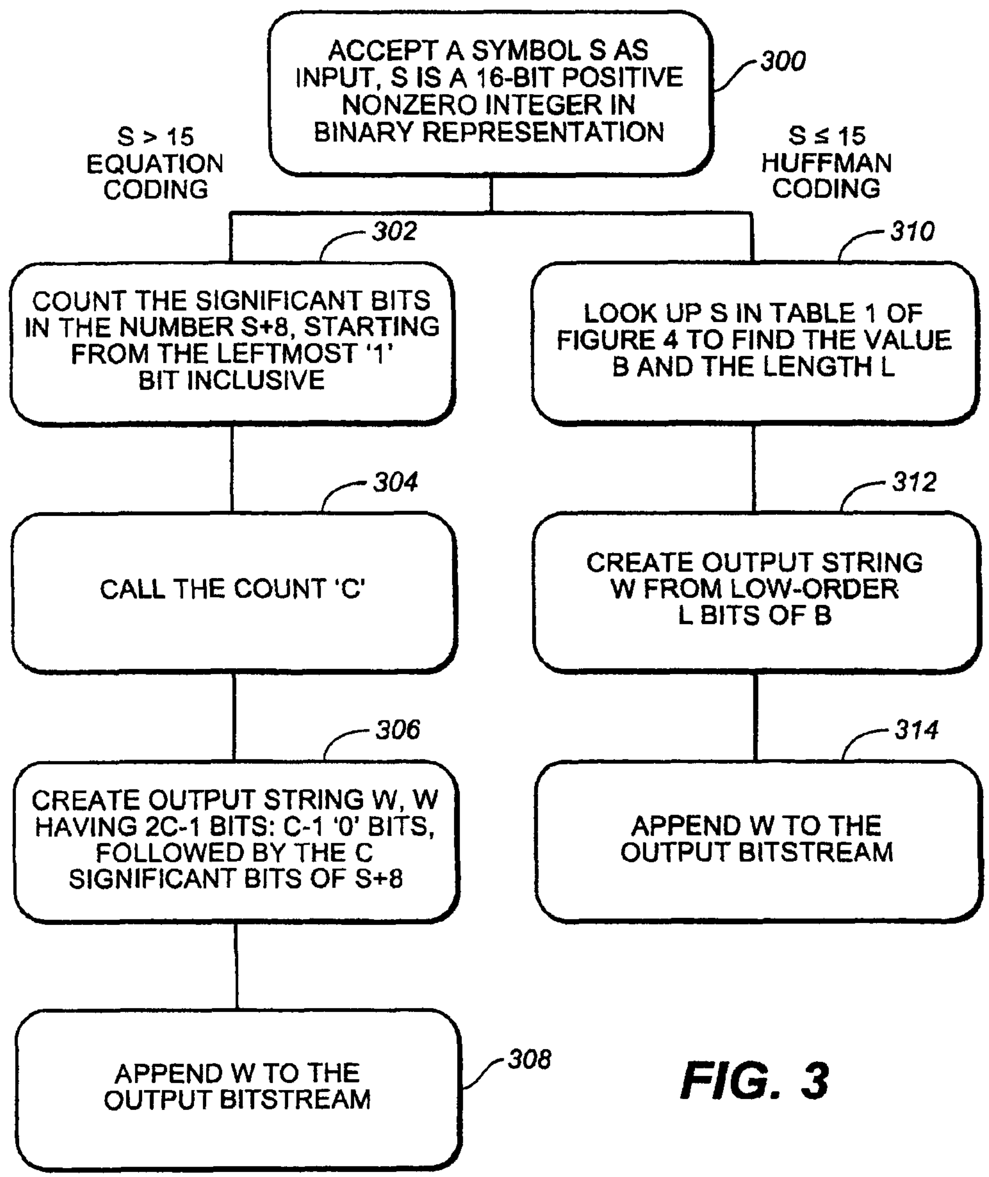
FIG. 3 is a flow chart showing a process of selecting and applying a Huffman coding technique and a computational generation technique for a positive non-zero integer.

FIG. 3 is a flow chart that demonstrates a process of selecting and applying the Huffman coding technique and a computational generation technique, for a positive non-zero integer. In operation 300, this example algorithm accepts as input a symbol S, which is a 16-bit positive nonzero integer in binary representation. It produces a bitstring W as output. FIG. 4 is a table used by Example algorithm 1.

Step 1.

If S>15, go to Step 3.

Step 2.

Look up S in Table 1 given below, to find the value B and the length L.

W consists of the low-order L bits of B.

Append W to the output bitstream. End.

Step 3.

Count the significant bits in the number S+8, starting from the leftmost '1' bit inclusive. Call the count C.

Step 4.

W consists of 2C-1 bits: C-1 '0' bits, followed by the C significant bits of S+8.

Append W to the output bitstream. End.

TABLE 1 for Example Algorithm 1

| Symbol | L | B | Output bitstring |
|---|---|---|---|
| 1 | 1 | 1 | 1 |
| 2 | 3 | 3 | 010 |
| 3 | 3 | 3 | 001 |
| 4 | 5 | 5 | 00100 |
| 5 | 5 | 5 | 00101 |
| 6 | 5 | 6 | 00110 |
| 7 | 5 | 7 | 00111 |
| 8 | 6 | 4 | 000100 |
| 9 | 6 | 5 | 000101 |
| 10 | 6 | 6 | 000110 |
| 11 | 6 | 7 | 000111 |
| 12 | 8 | 8 | 00001000 |
| 13 | 8 | 9 | 00001010 |
| 14 | 8 | 10 | 00001010 |
| 15 | 8 | 11 | 00001011 |

For comparison purposes, Table 2 below provides the output that would have been provided by steps 3 and 4 above (computational generation of codewords) for symbol values less than 16 if Table 1 were not used. It can be seen by comparing the two tables that using the Huffman table approach of Table 1 provides shorter codewords for some of the more frequent symbols as compared with the computational generation approach of Table 2.

TABLE 2 for Example Algorithm 1

| Symbol | L | B | Output bitstring |
|---|---|---|---|
| 1 | 1 | 1 | 1 |
| 2 | 3 | 2 | 010 |
| 3 | 3 | 3 | 011 |
| 4 | 5 | 4 | 00100 |
| 5 | 5 | 5 | 00101 |
| 6 | 5 | 6 | 00110 |
| 7 | 5 | 7 | 00111 |
| 8 | 7 | 8 | 0001000 |
| 9 | 7 | 9 | 0001001 |
| 10 | 7 | 10 | 0001010 |
| 11 | 7 | 11 | 0001011 |
| 12 | 7 | 12 | 0001100 |
| 13 | 7 | 13 | 0001101 |
| 14 | 7 | 14 | 0001110 |
| 15 | 7 | 15 | 0001111 |

Performance

The method of this example achieves the goal of high performance when implemented on some computer platforms because:

It offers an arbitrary Huffman code for the most common cases;

to match optimally that part of the probability distribution as measured, it needs only a small table that easily fits in limited memory;

it uses a very simple computation of exp-Golomb coding for the less-common cases;

no matter what the symbol, operation is fast.

Various enhancements can be made to the above example implementation of the present invention. For instance, the entropy coder can be modified to encode signed number symbols as well as the unsigned (positive only) symbols above. To do this efficiently, each L entry in the table is increased by one, the sign bit is appended to each B value, and table entries for negative symbols are included. Table 3 below provides an example. In this table, there is an entry for symbol 0 to allow quicker direct lookup. Since this 0 symbol entry is a dummy entry that is not used, its content is immaterial.

The simple algorithm above is modified slightly for this case as in Algorithm 2.

EXAMPLE ALGORITHM 2

Figure 5:
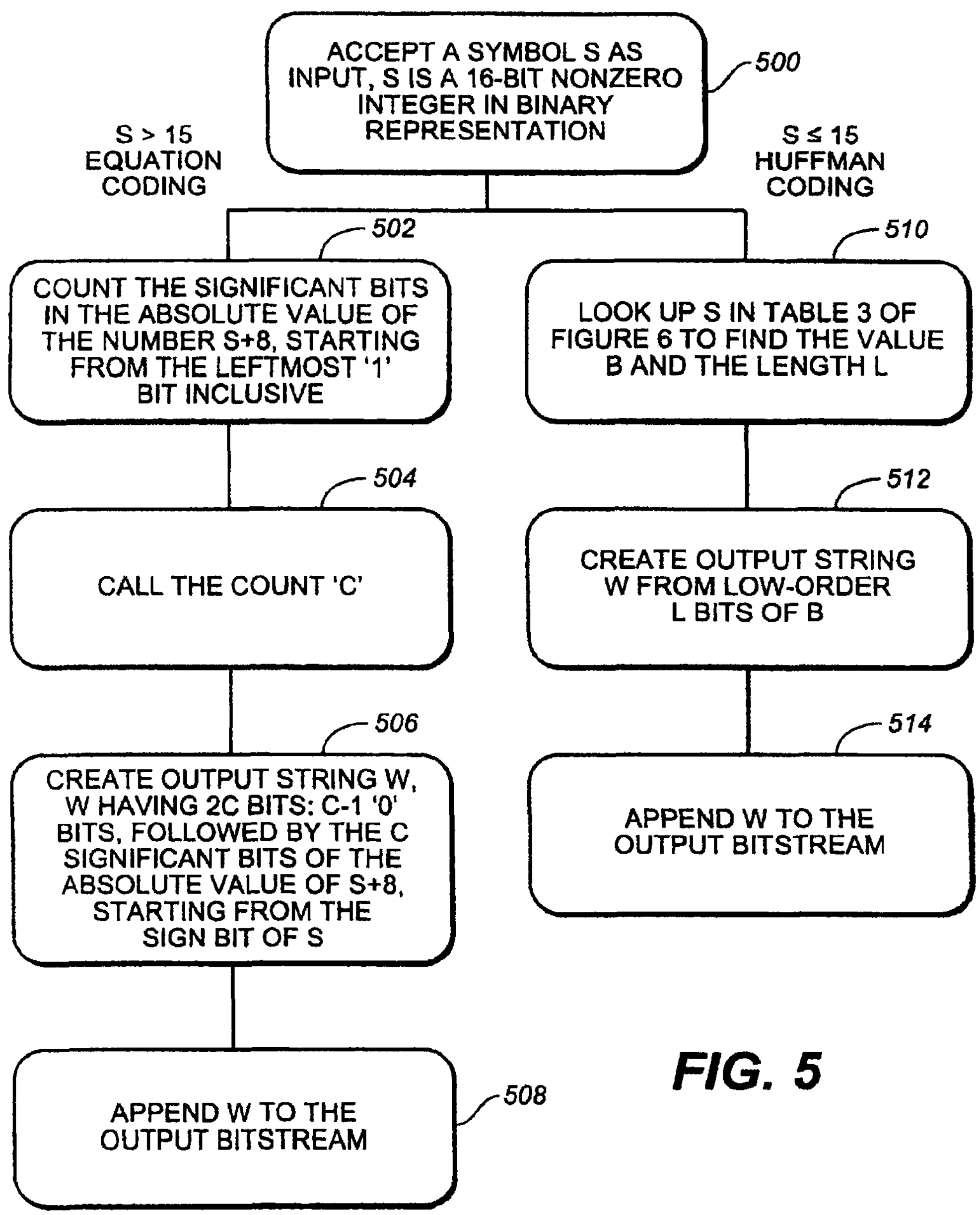
FIG. 5 is a flow chart showing a process of selecting and applying a Huffman coding technique and a computational generation technique for a signed integer.

FIG. 5 is a flow chart that demonstrates a process of selecting and applying the Huffman coding technique and a computational generation technique, for a signed integer. In process 500, the algorithm accepts as input a symbol S, a 16-bit integer in binary representation (value zero is not allowed). It produces a bit string W as output, for bitwise appending to the compressed bitstream being generated. FIG. 6 is a table used by Example algorithm 2.

Step 1. If the absolute value of S is greater than 15, go to Step 3.

Step 2. Look up S in Table 3 below, to find the value B and the length L.

W consists of the low-order L bits of B.

Append W to the output bitstream. End.

Step 3.

Count the significant bits in the absolute value of the number S+8, starting from the leftmost '1' bit inclusive. Call it C.

Step 4.

W consists of 2C bits: C-1 '0' bits, followed by the C significant bits of the absolute value of S+8, followed by the sign bit of S.

Append W to the output bitstream. End.

TABLE 3 for Example Algorithm 2

| Symbol | L | B | Output bitstring |
|---|---|---|---|
| −15 | 9 | 23 | 000010111 |
| −14 | 9 | 21 | 000010101 |
| −13 | 9 | 19 | 000010011 |
| −12 | 9 | 17 | 000010001 |
| −11 | 7 | 15 | 0001111 |
| −10 | 7 | 13 | 0001101 |
| −9 | 7 | 11 | 0001011 |
| −8 | 7 | 9 | 0001001 |
| −7 | 6 | 15 | 001111 |
| −6 | 6 | 13 | 001101 |
| −5 | 6 | 11 | 001011 |
| −4 | 6 | 9 | 001001 |
| −3 | 4 | 7 | 0111 |
| −2 | 4 | 5 | 0101 |
| −1 | 2 | 3 | 11 |
| 0 | 0 | 0 | (unused) |
| 1 | 2 | 2 | 10 |
| 2 | 4 | 4 | 0100 |
| 3 | 4 | 6 | 0110 |
| 4 | 6 | 8 | 001000 |
| 5 | 6 | 10 | 001010 |
| 6 | 6 | 12 | 001100 |
| 7 | 6 | 14 | 001110 |
| 8 | 7 | 8 | 0001000 |
| 9 | 7 | 10 | 0001010 |
| 10 | 7 | 12 | 0001100 |
| 11 | 7 | 14 | 0001110 |
| 12 | 9 | 16 | 000010000 |
| 13 | 9 | 18 | 000010010 |
| 14 | 9 | 20 | 000010100 |
| 15 | 9 | 22 | 000010110 |

In the examples above, the advantages of Huffman coding by table lookup (optimum matching to a known or measured probability distribution) can be combined with the advantages of simple computed coding such as exp-Golomb (quick computation with no lookup) while avoiding the disadvantage of full Huffman coding (very large table). We also demonstrate a way to encode signed symbol data faster by incorporating the sign bit into the lookup table for the common cases without introducing extra bits to the output.

In a manner similar to that described above, various combinations of table lookup and computational generation can be employed. For instance, two different equations can be used, each one being applied to a different subset of the symbols being encoded. An advantage to using such a combination might be that a single known equation does not match well the probability distribution of a particular data type, but two or more equations in combination provide a closer match. Another advantage might be that a simpler equation can be utilized for the more common symbols to increase the overall processing speed of the coding.

In another embodiment, data is encoded using multiple tables in conjunction with one or more equations. Equations are used for portions of the data where the equations accurately describe the probability distributions of the data portions. Tables can be interspersed with the equations to cover gaps where no fast computational encoding is known.

While the above is a complete description of the preferred embodiments of the invention, various alternatives, modifications, and equivalents may be used. Therefore, the above description should not be taken as limiting the scope of the invention which is defined by the appended claims.

What is claimed is:

1. A method of compressing data, comprising:

calculating from an incoming data stream binary representations of magnitudes of symbols for each portion of the incoming data stream according to an algorithmic analysis;

selectively applying a first coding technique to symbols of the portions of the incoming data stream that have binary representations of magnitudes greater than a first threshold value;

selectively applying a second coding technique to portions of the incoming data stream that have binary representations of magnitudes less than the first threshold value but greater than a second threshold value; and selectively applying a third coding technique to portions of the incoming data stream that have binary representations of magnitudes less than the second threshold value.

2. A system comprising:

means for assigning from an incoming data stream binary representations of magnitudes of symbols to each of the portions of the incoming data stream;

means for applying a first coding technique when binary representations of the magnitudes of symbols of any portion of the incoming data stream is greater than a first threshold value;

means for applying a second coding technique when the binary representations of magnitude of any portion of the incoming data stream is less than the first threshold value but greater than a second threshold value; and means for applying a third coding technique when the binary representations of magnitude of any portion of the incoming data stream is less than the second threshold value.

3. The method as claimed in claim 1, wherein the first coding technique comprises an exponential Golumb encoding method encoding the portions of the incoming data stream that have binary representations of magnitudes greater than the first threshold value.

4. The system as claimed in claim 2, wherein the means for applying the first coding technique comprises an exponential Golumb encoder encoding any portion of the incoming data stream having a binary representation of a magnitude that is greater than the first threshold value.

5. The system as claimed in claim 4, wherein the means for applying the third coding technique comprises a Huffman encoder for encoding any portion of the incoming data stream having a binary representation of a magnitude that is less than the second threshold value.

6. The method as claimed in claim 3, wherein the third coding technique comprises Huffman encoding any portion of the incoming data stream having a binary representation of a magnitude that is less than the second threshold value.

* * * * *